US012486448B2

(12) United States Patent
Kim et al.

(10) Patent No.: US 12,486,448 B2
(45) Date of Patent: Dec. 2, 2025

(54) PEROVSKITE COMPOUND-BASED ELECTROLUMINESCENT LAYER AND LIGHT EMITTING DEVICE COMPRISING SAME

(71) Applicant: Industry-Academic Cooperation Foundation, Yonsei University, Seoul (KR)

(72) Inventors: Jiwon Kim, Seoul (KR); Dongjun Kim, Incheon (KR); Seoyeah Oh, Bucheon-si (KR); Jihyeon Park, Incheon (KR); Geonho Kim, Jeonju-si (KR); Jiyeon Lee, Cheongju-si (KR); Seoyoung Yoon, Cheonan-si (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 448 days.

(21) Appl. No.: 18/044,839

(22) PCT Filed: Sep. 10, 2021

(86) PCT No.: PCT/KR2021/012360
§ 371 (c)(1),
(2) Date: May 19, 2023

(87) PCT Pub. No.: WO2022/055304
PCT Pub. Date: Mar. 17, 2022

(65) Prior Publication Data
US 2024/0015994 A1    Jan. 11, 2024

(30) Foreign Application Priority Data
Sep. 11, 2020  (KR) ......................... 10-2020-0116546

(51) Int. Cl.
*C09K 11/02* (2006.01)
*C09K 11/66* (2006.01)
(Continued)

(52) U.S. Cl.
CPC .......... *C09K 11/025* (2013.01); *C09K 11/665* (2013.01); *H10K 50/115* (2023.02);
(Continued)

(58) Field of Classification Search
CPC .. C09K 11/025; C09K 11/665; H10K 50/115; H10K 71/12
See application file for complete search history.

(56) References Cited

U.S. PATENT DOCUMENTS 6,261,469 B1 * 7/2001 Zakhidov .............. C04B 38/045
427/255.12
6,517,763 B1 * 2/2003 Zakhidov ............... B82Y 20/00
427/255.12
(Continued)

FOREIGN PATENT DOCUMENTS

CN    109897311 B  *  8/2020
CN    112154195 A  * 12/2020  ............... C08K 3/16
(Continued)

OTHER PUBLICATIONS

English Translation of International Search Report of PCT/KR2021/012360, mailed Dec. 21, 2021.
(Continued)

*Primary Examiner* — Laura M Menz
(74) *Attorney, Agent, or Firm* — DICKINSON WRIGHT PLLC (57) ABSTRACT

An electroluminescent layer according to the present invention comprises a core-shell particle comprising a perovskite crystal core and a shell of a dielectric polymer, wherein a charge transfer pathway to the perovskite crystal core is
(Continued)

formed by dielectric breakdown of the dielectric polymer. The electroluminescent layer according to the present invention can prevent the deterioration of perovskite crystals due to external moisture, oxygen, or the like since the perovskite crystal core is enclosed and protected by the dielectric polymer and can have improved charge transfer and injection efficiencies since charges are directly transferred and injected to the perovskite crystals through the charge transfer pathway formed by dielectric breakdown of the dielectric polymer.

23 Claims, 1 Drawing Sheet

(51) Int. Cl.
  *H10K 50/115* (2023.01)
  *H10K 71/12* (2023.01)
  *H10K 85/10* (2023.01)
  *H10K 85/50* (2023.01)
(52) U.S. Cl.
  CPC ........... *H10K 71/12* (2023.02); *H10K 85/111* (2023.02); *H10K 85/50* (2023.02)

(56) References Cited

U.S. PATENT DOCUMENTS

| | | | | |
|---|---|---|---|---|
| 9,393,396 | B2* | 7/2016 | Peyman | A61K 9/0009 |
| 10,950,761 | B2* | 3/2021 | Pathak | H10H 20/0137 |
| 11,396,586 | B1* | 7/2022 | Diest | C08J 9/286 |
| 11,715,599 | B2* | 8/2023 | Yializis | H01G 4/304 |
| | | | | 361/301.4 |
| 12,092,845 | B2* | 9/2024 | Lüchinger | C09K 11/565 |
| 12,281,223 | B2* | 4/2025 | Markanday | C08J 5/18 |
| 2001/0019037 | A1* | 9/2001 | Zakhidov | C04B 38/0022 |
| | | | | 216/56 |
| 2016/0022976 | A1* | 1/2016 | Peyman | A61K 47/6929 |
| | | | | 600/407 |
| 2016/0226010 | A1* | 8/2016 | Weitekamp | H10K 71/211 |
| 2019/0348577 | A1* | 11/2019 | Pathak | C09K 11/664 |
| 2020/0161049 | A1* | 5/2020 | Yializis | C08F 222/102 |
| 2020/0194179 | A1* | 6/2020 | Yializis | C08F 122/14 |
| 2022/0194969 | A1* | 6/2022 | Lee | C09K 11/02 |
| 2023/0331972 | A1* | 10/2023 | Markanday | C08J 5/18 |
| 2024/0015994 | A1* | 1/2024 | Kim | C09K 11/665 |
| 2024/0141128 | A1* | 5/2024 | Diest | G02F 1/225 |

FOREIGN PATENT DOCUMENTS

| | | | | |
|---|---|---|---|---|
| CN | 119060483 A | * | 12/2024 | ............. H01G 4/206 |
| EP | 4016140 A1 | * | 6/2022 | ................ G02F 1/19 |
| EP | 4016140 B1 | * | 1/2025 | ............. G02B 26/02 |
| KR | 10-2018-0057198 A | | 5/2018 | |
| KR | 10-2018-0074662 A | | 7/2018 | |
| KR | 10-2018-0094280 A | | 8/2018 | |
| KR | 20220034695 A | * | 3/2022 | ............. H10K 85/50 |
| KR | 102664720 B1 | * | 5/2024 | ............. H10K 85/50 |
| WO | WO-2010053338 A2 | * | 5/2010 | ......... H01L 51/5012 |
| WO | WO-2015048666 A1 | * | 4/2015 | ............. H01G 4/206 |
| WO | WO-2019177537 A1 | * | 9/2019 | ............. C09K 11/02 |
| WO | WO-2020130592 A1 | * | 6/2020 | ............. H10K 85/50 |
| WO | WO-2021137462 A1 | * | 7/2021 | ............. C09K 11/00 |
| WO | WO-2022034390 A1 | * | 2/2022 | ........... H10N 30/857 |
| WO | WO-2022055304 A1 | * | 3/2022 | ............. H10K 85/50 |

OTHER PUBLICATIONS

Hou, S., et al., "Synthesis and Stabilization of Colloidal Perovskite Nanocrystals by Multidentate Polymer Micelles", ACS Appl. Mater. Interfaces; May 19, 2017, vol. 9, No. 22, pp. 18417-18422.
You, N., et al. "Facile Fabrication of Size-Tunable Core/Shell Ferroelectric/Polymeric Nanoparticles with Tailorable Dielectric Properties via Organocatalyzed Atom Transfer Radical Polymerization Driven by Visible Light", Scientific Reports; Feb. 12, 2019, vol. 9, No. 1, pp. 1-12.

* cited by examiner

PEROVSKITE COMPOUND-BASED ELECTROLUMINESCENT LAYER AND LIGHT EMITTING DEVICE COMPRISING SAME

CROSS-REFERENCE TO RELATED APPLICATIONS

This application is a 35 U.S.C. § 371 national phase of PCT International Application No. PCT/KR2021/012360, filed Sep. 10, 2021, which claims the benefit of priority under 35 U.S.C. § 119 to Republic of Korea Patent Application No. 10-2020-0116546, filed Sep. 11, 2020, the contents of which are incorporated herein by reference in its entirety.

FIELD

The present invention relates to a perovskite compound-based electroluminescent layer, and more particularly, to a perovskite compound-based electroluminescent layer having excellent stability and improved luminous efficiency, and a light emitting device including the same.

BACKGROUND

Since an organic/inorganic halide perovskite compound allows easy adjustment of a band gap by controlling a quantum size effect, a halide composition, has a high photoluminescence quantum yield of 90% or more as compared with conventional inorganic quantum dots such as CdSe or CdS, and has excellent color purity, and the like, it receives great attention in the photoelectronic field such as display devices, lasers, and light emitting diodes.

However, since the perovskite compound is very easily deteriorated by external factors such as moisture and oxygen to rapidly decrease photoluminescence properties, research to improve the stability of the perovskite compound is being conducted.

For stability improvement, a technology to control a perovskite compound composition to improve the stability of a material itself and a technology to embed perovskite crystals in a polymer matrix or coat perovskite crystals with a polymer to protect the perovskite crystals from the external environment are being developed.

However, when stability is improved by embedding the perovskite crystals in a polymer matrix or coating the perovskite crystals with a polymer, it is difficult to transfer and inject charges to the perovskite crystals, so that luminous efficiency is greatly lowered.

SUMMARY

An object of the present invention is to provide a perovskite compound-based electroluminescent layer having improved stability and improved charge transfer and injection efficiency, and a light emitting device including the same.

In one general aspect, an electroluminescent layer (I) includes: core-shell particles including a perovskite crystal core and a dielectric polymer shell, wherein a charge transfer pathway to the perovskite crystal core is formed by dielectric breakdown of the dielectric polymer.

In the electroluminescent layer (I) according to an exemplary embodiment of the present invention, the core-shell particles adjacent to each other may be in a state of being bound to each other.

In the electroluminescent layer (I) according to an exemplary embodiment of the present invention, the core-shell particles may be in a state of being the most closely packed.

In another general aspect, an electroluminescent layer (II) includes: a dielectric polymer matrix; perovskite crystals which are separately embedded in the dielectric polymer matrix and have a closest packed structure; and a charge transfer pathway which is formed by dielectric breakdown of the dielectric polymer and connects perovskite crystals.

In the electroluminescent layers (I and II) according to an exemplary embodiment of the present invention, a spacing between the perovskite crystals may be 10 nm or less.

In the electroluminescent layers (I and II) according to an exemplary embodiment of the present invention, a dielectric constant of the dielectric polymer may be 2 or more.

In the electroluminescent layers (I and II) according to an exemplary embodiment of the present invention, the dielectric polymer may include an amphiphilic block copolymer.

In the electroluminescent layers (I and II) according to an exemplary embodiment of the present invention, the charge transfer pathway may be a carbon channel produced by the dielectric breakdown.

In the electroluminescent layer (I) according to an exemplary embodiment of the present invention, the core-shell particles adjacent to each other may be in a state of being integrally connected by polymerization between shells.

In the electroluminescent layers (I and II) according to an exemplary embodiment of the present invention, the perovskite crystal may have a diameter of 10 to 300 nm.

In the electroluminescent layers (I and II) according to an exemplary embodiment of the present invention, the perovskite crystal may satisfy the following Chemical Formulae 1 to 4:

$$AMX_3 \qquad \text{(Chemical Formula 1)}$$

$$A_2MX_4 \qquad \text{(Chemical Formula 2)}$$

$$AMX_4 \qquad \text{(Chemical Formula 3)}$$

$$A_3MX_5 \qquad \text{(Chemical Formula 4)}$$

wherein A is an alkali metal, M is a divalent metal, and X is a halogen.

The present invention includes a light emitting device including the electroluminescent layer described above.

Specifically, in another general aspect, a light emitting device includes: a first electrode; a hole transport layer placed on the first electrode; the electroluminescent layer described above placed on the hole transport layer; an electron transport layer placed on the electroluminescent layer; and a second electrode placed on the electron transport layer.

The present invention includes a method of producing the electroluminescent layer described above.

In still another general aspect, a method of producing an electroluminescent layer includes: applying voltage to a precursor film in which perovskite crystals are enclosed in a dielectric polymer to cause dielectric breakdown of the dielectric polymer.

The method of producing an electroluminescent layer according to an exemplary embodiment of the present invention may further include: before the applying of voltage, a) injecting a perovskite solution including an alkali metal halide, a divalent metal halide, a surfactant, and a first polymerizable monomer into an aprotic solvent to produce perovskite crystals modified by a polymerizable monomer; b) using a polymerization solution including the perovskite crystals modified by a polymerizable monomer, a second polymerizable monomer, and an initiator to produce core-shell particles having a dielectric polymer shell formed by polymerizing the second polymerizable monomer on a perovskite crystal surface; and c) producing a film of the core-shell particles.

The method of producing an electroluminescent layer according to an exemplary embodiment of the present invention may further include: after step c) and before the applying of voltage, d) spraying an initiator solution including an initiator and an organic solvent onto the film of the core-shell particles and activating the initiator to bind shells between adjacent core-shell particles to each other.

In the method of producing an electroluminescent layer according to an exemplary embodiment of the present invention, the organic solvent in step d) may be a solvent which dissolves the dielectric polymer.

In the method of producing an electroluminescent layer according to an exemplary embodiment of the present invention, the initiator solution in step d) may further include a third polymerizable monomer.

In the method of producing an electroluminescent layer according to an exemplary embodiment of the present invention, the first polymerizable monomer and the second polymerizable monomer may be independently of each other one or two or more selected from acrylate-based monomers, methacrylate-based monomers, styrene-based monomers, and siloxane-based monomers.

The method of producing an electroluminescent layer according to an exemplary embodiment of the present invention may further include: before the applying of voltage, I) dissolving an amphiphilic block copolymer in a solvent to produce a micelle solution of the amphiphilic block copolymer; II) adding a divalent metal halide to the micelle solution and stirring the solution; III) adding an alkali metal halide to the micelle solution to which the divalent metal halide has been added and stirring the solution to produce core-shell particles having a perovskite crystal core and an amphiphilic block copolymer shell which is a dielectric polymer shell; and IV) producing a film of the core-shell particles.

In the method of producing an electroluminescent layer according to an exemplary embodiment of the present invention, the amphiphilic block copolymer may include a polyvinylpyridine-based polymer block.

In the method of producing an electroluminescent layer according to an exemplary embodiment of the present invention, the polyvinylpyridine-based polymer block may be poly(2-vinylpyridine) or poly(4-vinylpyridine).

In the method of producing an electroluminescent layer according to an exemplary embodiment of the present invention, a weight ratio between hydrophobic polymer block:polyvinylpyridine-based polymer block in the amphiphilic block copolymer may be 1:0.8 to 1.2.

In the method of producing an electroluminescent layer according to an exemplary embodiment of the present invention, the solvent of step I) may be a non-solvent of the perovskite crystals, and after step II) and before step III), a step of removing the divalent metal halide remaining as a solid phase may be further included.

The electroluminescent layer according to the present invention may prevent deterioration of perovskite crystals by external moisture, oxygen, or the like since the perovskite crystal core is enclosed in and protected by a dielectric polymer, and may have improved charge transfer and injection efficiencies since charges are directly transferred and injected into the perovskite crystals through a charge transfer pathway produced by dielectric breakdown of the dielectric polymer.

DETAILED DESCRIPTION

Hereinafter, referring to accompanying drawings, an electroluminescent layer of the present invention and a light emitting device including the same will be described in detail. The drawings to be provided below are provided by way of example so that the spirit of the present invention can be sufficiently transferred to a person skilled in the art to which the present invention pertains. Therefore, the present invention is not limited to the drawings provided below but may be embodied in many different forms, and the drawings suggested below may be exaggerated in order to clarify the spirit of the present invention. Technical terms and scientific terms used herein have the general meaning understood by those skilled in the art to which the present invention pertains unless otherwise defined, and a description for the known function and configuration which may unnecessarily obscure the gist of the present invention will be omitted in the following description and the accompanying drawings.

In addition, the singular form used in the specification and claims appended thereto may be intended to include a plural form also, unless otherwise indicated in the context.

In the present specification and the appended claims, the terms such as "first" and "second" are not used in a limited meaning but are used for the purpose of distinguishing one constituent element from other constituent elements.

In the present specification and the appended claims, the terms such as "comprise" or "have" mean that there is a characteristic or a constitutional element described in the specification, and as long as it is not particularly limited, a possibility of adding one or more other characteristics or constitutional elements is not excluded in advance.

In the present specification and the appended claims, when a portion such as a membrane (layer), a region, and a constituent element is present on another portion, not only a case in which the portion is in contact with and directly on another portion but also a case in which other membranes (layers), other regions, other constitutional elements are interposed between the portions is included.

The electroluminescent layer according to the present invention includes core-shell particles including a perovskite crystal core and a dielectric polymer shell, wherein a charge transfer pathway to the perovskite crystal core is formed by dielectric breakdown of the dielectric polymer.

As described above, since the electroluminescent layer according to the present invention has a core-shell structure in which the perovskite crystals are enclosed in the dielectric polymer, the perovskite crystals may be protected from external stimuli such as moisture or oxygen to improve stability of a perovskite compound. In addition to the stability improvement, since charges are transferred and injected into the perovskite core through the charge transfer pathway formed by dielectric breakdown of the dielectric polymer shell, a decrease in charge injection efficiency by a shell which is an insulator may be prevented.

In the present invention, a perovskite crystal or a perovskite compound refers to an inorganic metal halide having a perovskite structure. Representatively, the perovskite compound may satisfy the chemical formula of $AMX_3$ based on an inorganic cation (A), as a specific example, an alkali metal (A), a divalent metal cation (M), and a halogen anion (X), but is not limited thereto, and may satisfy the chemical formulae such as $AMX_4$, $A_2MX_4$, and $A_3MX_5$. In addition, the perovskite compound may have a three-dimensional structure in which A is bonded to 12 X's as $AX_{12}$ to form a cubic octahedral structure and M is bonded to X as $MX_6$ in an octahedral structure, but a two-dimensional structure is not excluded.

As a specific example, the halogen anion may be one or two or more selected from $I^-$, $Br^-$, $F^-$, and $Cl^-$. An example of the divalent metal ion may include one or two or more selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, but is not limited thereto. An example of the monovalent inorganic cation may include one or two or more selected from Nat, $K^+$, $Rb^+$, $Cs^+$, and $Fr^+$, but is not limited thereto.

The perovskite crystals may have a diameter of 10 to 300 nm, 10 to 250 nm, 10 to 200 nm, 10 to 100 nm, 10 to 50 nm, or 10 to 30 nm. Thus, the core-shell particles may be core-shell particles including perovskite quantum dots or a perovskite nanocrystal as a core and a dielectric polymer as a shell. In particular, it is advantageous that the core-shell particles have perovskite quantum dots at a level of 10 nm to 30 nm as a core, since a luminescence wavelength may be controlled by a quantum confinement effect as well as the composition of the perovskite compound. In addition, it is advantageous that the core-shell particles have a perovskite quantum dot at a level of 10 to 30 nm as a core, since the electroluminescent layer may contain a larger amount of a luminous source (perovskite compound) based on the same dimensions.

In a specific example, the electroluminescent layer may be a particle layer in which core-shell particles are packed. Herein, the particle layer may be a monolayer or a multilayer structure in which two or more particles are laminated. When the particle layer has a multilayer structure, the particle layer may be a lamination of 2 to 100 monolayers, but is not necessarily limited thereto.

The packing structure of the core-shell particle may include a closest packed structure, and as an example, when the electroluminescent layer is a monolayer of the core-shell particles, it may have a closest packed structure having the number of nearest neighboring core-shell particles of 5 to 6, substantially 6. As another example, when the electroluminescent layer has a multilayer structure in which the layer of the core-shell particles is laminated in multiple layers, it may have a closest packed structure being face centered cubic (FCC) or hexagonal closed packed (HCP) having the number of nearest neighboring core-shell particles of 11 to 12, substantially 12.

In a specific example, the core-shell particles included in the electroluminescent layer may be in a state of being bound to each other. Specifically, any one core-shell particle may be in a state of being bound to another core-shell particle and physically integrally connected. Specifically, the core-shell particles adjacent to each other may be in a state of being integrally connected by binding between dielectric polymer shells, and binding between shells may be formed by polymerization between each shell dielectric polymer. Since the binding between core-shell particles is formed by polymerization in a shell area in contact with each other, substantially, the core-shell particles adjacent to each other may be in a state of being in a surface contact (planar contact by shell), not in a point contact.

In terms of a method, the binding by the polymerization between shells in a contact area of core-shell particles adjacent to each other may be performed by spraying an initiator solution including an initiator and an organic solvent onto a particle layer in which core-shell particles are packed and activating the initiator to cause a polymerization reaction.

Furthermore, the initiator solution may further include a polymerizable monomer (third polymerizable monomer) so that the core-shell particles are closely adhered and bound without a void between the particles in the binding by the polymerization between shells, and the third polymerizable monomer is polymerized to fill undesired voids between particles.

However, the third polymerizable monomer may be selectively adopted if necessary, and when the perovskite crystals are very fine at the level of a few to several tens of nanometers, as an example, a perovskite quantum dot, a large amount of the initiator solution including an initiator and an organic solvent in the packed particle layer is sprayed on the packed particle layer and the initiator is activated to cause a polymerization reaction, thereby deriving the polymerization between shells so that substantially almost nothing remains in an empty space between the particles.

When substantially almost nothing remains in an empty space between the particles by the polymerization between shells, the shell area bound to each other by the polymerization between shells may correspond to a matrix of the dielectric polymer, and the electroluminescent layer may have a charge transfer pathway formed inside by the dielectric breakdown of the dielectric polymer (matrix) derived by voltage application. The charge transfer pathway may be a carbon channel produced by dielectric breakdown of the dielectric polymer.

Thus, as described above, the electroluminescent layer according to an aspect may include a perovskite crystal core; a dielectric polymer shell enclosing the perovskite crystal core; and a charge transfer pathway which is a carbon channel penetrating the dielectric polymer shell.

In addition, the electroluminescent layer according to another aspect may include: a polymer matrix of the dielectric polymer, perovskite crystals dispersed and embedded in the polymer matrix, and a charge transfer pathway which is a carbon channel penetrating the dielectric polymer matrix. That is, the electroluminescent layer according to another embodiment of the present invention may include: a dielectric polymer matrix; perovskite crystals which are separately embedded in the dielectric polymer matrix and has a closest packed structure; and a charge transfer pathway which is formed by dielectric breakdown of the dielectric polymer and connects perovskite crystals.

Herein, the closest packed structure may be based on the perovskite crystals which are separately embedded in the dielectric polymer matrix, and may have a multilayer structure in which a monolayer of the perovskite crystals or two or more layers of the perovskite crystals are laminated. When it has a multilayer structure, 2 to 100 layers of the perovskite crystals may be laminated, but the present invention is not necessarily limited thereto. When it is the monolayer of the perovskite crystals, it may have a closest packed structure having the number of nearest neighboring perovskite crystals of 5 to 6, substantially 6. As another example, when the layer of the perovskite crystals in the electroluminescent layer has a multilayer structure, it may have a closest packed structure being face centered cubic (FCC) or hexagonal closed packed (HCP) having the number of nearest neighboring perovskite crystals of 11 to 12, substantially 12. Herein, the layer of the perovskite crystals refers to a layer in which a plurality of perovskite crystals are separately arranged to each other one imaginary plane, and may not be interpreted as a physical layer in which the perovskite crystals are successively connected to each other, of course.

As described above, the electroluminescent layer may have a charge transfer pathway formed inside by dielectric breakdown of the dielectric polymer derived by voltage application. The charge transfer pathway may be a carbon channel produced by the dielectric breakdown of the dielectric polymer, and specifically, may be a carbon nanofiber produced by the dielectric breakdown. Thus, the electroluminescent layer may include a perovskite crystal; a dielectric polymer enclosing the perovskite crystal; and a charge transfer pathway which is a carbon channel penetrating a dielectric polymer shell and connecting the perovskite crystals, as an example, a carbon nanofiber. The carbon nanofiber produced by the dielectric breakdown of the dielectric polymer is advantageous since it may transfer charges to the perovskite core without a loss, and furthermore, is also advantageous since it may improve charge injection efficiency by band gap matching between a hole transport layer or an electron transport layer of the light emitting device and quantum dots.

In a specific example, a spacing (shortest separation distance) between the perovskite crystals in the electroluminescent layer may be at a level of 10 nm or less, specifically 1 to 10 nm, more specifically 2 to 8 nm, and more specifically 2 to 6 nm. Specifically based on the porous electroluminescent layer which does not lose a core-shell particle shape by the polymerization between shells, the dielectric polymer shell enclosing the perovskite crystal core may have a thickness at a level of 0.5 to 5 nm, specifically 1 to 5 nm, and more specifically 1 to 4 nm. The spacing between fine perovskite crystals as such is advantageous, since the dielectric polymer positioned between the perovskite crystal cores may be dielectrically broken down more easily at a low breakdown voltage, and a stable current transfer pathway may be produced.

In a specific example, the dielectric constant of the dielectric polymer may be 2 or more, specifically 2 to 10, more specifically 2 to 5, and still more specifically 2.2 to 4. In addition to the thin spacing between the perovskite crystals, the high dielectric constant of the dielectric polymer may also greatly lower the breakdown voltage required to form the current transfer pathway, and thus, the range is advantageous.

The dielectric polymer may be any insulating polymer having a high permittivity satisfying the dielectric constant described above. As an example, the dielectric polymer may be an acrylate-based polymer, a siloxane-based polymer, a styrene-based polymer, an amphiphilic block copolymer, and the like. As a substantial example, the dielectric polymer may be polystyrene, polymethylmethacrylate, polymethylacrylate, polyacrylate, polyacrylate-co-styrene, polymethylacrylate-co-styrene, polymethylmethacrylate-co-styrene, polydimethylsiloxane, polydiethylsiloxane, polymethylethylsiloxane, polydimethylsiloxane-co-diethylsiloxane, polydimethylsiloxane-co-ethylmethylsiloxane, polymethylhydroxysiloxane, polymethylpropylsiloxane, polymethylbutylsiloxane, polydiphenylsiloxane, polymethylphenylsiloxane, polyethylphenylsiloxane, poly(dimethylsiloxane-co-diphenylsiloxane), a mixture thereof, a copolymer thereof, or the like, but is not limited thereto. As another example, the dielectric polymer may be an amphiphilic block copolymer of a hydrophilic polymer block and a hydrophobic polymer block, and may be an amphiphilic block copolymer including a polyvinylpyridine-based polymer block as a hydrophilic polymer block. The polyvinylpyridine-based polymer block may include poly(2-vinylpyridine) or poly(4-vinylpyridine), and the hydrophobic polymer block may include polyethylene, polypropylene, polystyrene, polyalkyl (meta)acrylate, and polyester, but is not limited thereto. In the amphiphilic block copolymer, a weight ratio of hydrophobic polymer block:hydrophilic polymer block may be at a level of 1:0.8 to 1.2 so that perovskite crystal cores produced may be stably enclosed while stably forming micelles in a synthesis process, but the present disclosure is not necessarily limited thereto. The dielectric polymer enclosing the perovskite crystals may have a number average molecular weight of 5000 to 500000 g/mol, but is not limited thereto.

In a specific example, the dielectric polymer may be surface-polymerized on the surface of the perovskite crystals and enclose the perovskite crystals. The surface defects of the perovskite crystals are healed by the surface polymerization on the surface of the perovskite crystals and defect-healing may increase luminous efficiency. In terms of a production method, the surface polymerization may be performed by mixing perovskite crystals having a polymerizable monomer (first polymerizable monomer) as a surface ligand, an initiator, and a polymerizable monomer (second polymerizable monomer) and activating the initiator to cause a polymerization reaction.

In another specific example, the dielectric polymer may be an amphiphilic block copolymer, and the perovskite crystal may be in a state of binding to a hydrophilic polymer block of the amphiphilic block copolymer. This is because the hydrophilic polymer block adsorbs the precursor material of the perovskite crystal and the adsorbed precursor material is converted into the perovskite crystal to produce the core-shell particle, in the micelles of the amphiphilic block copolymer.

The present invention includes a light emitting device including the electroluminescent layer described above.

Specifically, the light emitting device according to the present invention includes: a first electrode; a hole transport layer placed on the first electrode; the electroluminescent layer described above placed on the hole transport layer; an electron transport layer placed on the electroluminescent layer; and a second electrode placed on the electron transport layer.

When voltage is applied to the first electrode and the second electrode, holes injected from the first electrode are transferred to the electroluminescent layer via the hole transport layer, electrons injected from the second electrode are transferred to the electroluminescent layer via the electron transport layer, the holes and the electrons injected into the electroluminescent layer are transferred and injected into the perovskite crystals through a carbon channel formed in the dielectric polymer, specifically a carbon nanofiber, to produce excitons, and the excitons may change from an excited state to a ground state to produce light.

Each of the first electrode, the second electrode, the hole transport layer, and the electron transport layer may be a material and have a thickness (as an example, 10 Å to 10000

Å) commonly used in a perovskite-based light emitting device used the perovskite compound as a luminescent material.

As an example, the first electrode may be a conductive polymer; a conductive metal oxide such as an indium tin oxide (ITO) or fluorine-doped tin oxide (FTO); a network of a conductive nanostructure such as graphene, carbon nanotubes, reduced graphene oxide, and metal nanowire; a metal grid, or the like, and the second electrode may be a metal having a low work function, as an example, lithium (Li), magnesium (Mg), aluminum (Al), aluminum-lithium (Al—Li), calcium (Ca), magnesium-indium (Mg—In), magnesium-silver (Mg—Ag), and the like, but the present disclosure is not limited thereto.

As an example, the hole transport layer may be any material commonly used as a hole transport layer, and as an example, may be mCP (N,N-dicarbazolyl-3,5-benzene); PEDOT:PSS (poly(3,4-ethylenedioxythiophene):polystyrene sulfonate); NPD (N,N'-di(1-naphthyl)-N,N'-diphenyl-benzidine); TPD (N,N'-bis(3-methylphenyl)-N, N'-diphenylbenzidine); DNTPD (N4,N4'-bis[4-[bis(3-methylphenyl)amino]phenyl]-N4,N4'-diphenyl-[1,1'-biphenyl]-4,4'-diamine); N,N'-diphenyl-N,N'-dinaphtyl-4,4'-diaminobiphenyl; N,N,N'N'-tetra-p-tolyl-4,4'-diaminobiphenyl; N,N,N'N'-tetraphenyl-4,4'-diaminobiphenyl; a porphyrin compound derivative such as copper (II) 1,10,15,20-tetrapheny-21H,23H-porphyrin; TAPC (1,1-bis[4-[N,N'-di(p-tolyl)amino]phenyl] cyclohexane); a triarylamine derivative such as N,N, N-tri(p-tolyl)amine, 4,4', 4'-tris[N-(3-methyllphenyl)-N-phenylamino]triphenylamine; a carbazole derivative such as N-phenylcarbazole and polyvinylcarbazole; a phthalocyanine derivative such as non-metallic phthalocyanine and copper phthalocyanine; a starburst amine derivative; an enaminestilbene-based derivative; derivatives of an aromatic tertiary amine and styryl amine compound; polysilane, and the like, but is not limited thereto. The hole transport layer may be a metal oxide having hole conductivity, as an example, $MoO_3$, $WO_3$, $V_2O_5$, nickel oxide (NiO), copper (II) oxide (CuO), copper aluminum oxide (CAO, $CuAlO_2$), zinc rhodium oxide (ZRO, $ZnRh_2O_4$), GaSnO, and inorganic substances such as GaSnO doped with metal-sulfide (FeS, ZnS, or CuS).

As a specific example, the electron transport layer may be $Alq_3$ (tris(8-hydroxyquinolinato)aluminum), TAZ (3-(biphenyl-4-yl)-5-(4-tert-butylphenyl)-4-phenyl-4H-1,2,4-triazole), BAlq (bis(8-hydroxy-2-methylquinoline)-(4-phenylphenoxy)aluminum), $BeBq_2$ (bis(10-hydroxybenzo [h] quinolinato)-beryllium), BCP (bathocuproine), Bphen (bathophenanthroline), TBPI (2,2',2"-(1,3,5-benzinetriyl)-tris(1-phenyl-1-H-benzimidazole)), TmPyPB (1,3,5-tri (m-pyridin-3-ylphenyl)benzene), 3TPYMB (tris(2,4,6-trimethyl-3-(pyridin-3-yl)phenyl) borane), TpPyPB (1,3,5-tri (p-pyrid-3-yl-phenyl)benzene), or the like, but is not necessarily limited thereto.

In addition, if necessary, a hole injection layer may be further provided between the first electrode and the hole transport layer, and an electron injection layer may be further provided between the second electrode and the electron transport layer. Herein, the electron injection layer may be known materials such as LiF, NaCl, CsF, $Li_2O$, BaO, $BaF_2$, or Liq (lithium quinolate), and the hole injection layer may be fullerene (C60), HAT-CN, F16CuPC, CuPC, m-MTDATA [4,4',4"-tris(3-methylphenylphenylamino) triphenylamine], NPB [N,N'-di(1-naphthyl)-N,N'-diphenyl-(1,1'-biphenyl)-4,4'-diamine], TDATA, 2T-NATA, Pani/DBSA (polyaniline/dodecylbenzenesulfonic acid), PEDOT/PSS (poly(3,4-ethylenedioxythiophene)/poly(4-styrene-sulfonate)), Pani/CSA (polyaniline/camphor sulfonic acid), or PANI/PSS (polyaniline/poly(4-styrenesulfonate)), but the present invention is not limited thereto.

The present invention includes a method of manufacturing the electroluminescent layer described above.

The method of producing an electroluminescent layer according to the present invention includes: applying voltage to a precursor film in which perovskite crystals are enclosed in a dielectric polymer to cause dielectric breakdown of the dielectric polymer. Herein, the insulation breakdown may be performed by disposing electrodes in each of two opposite surfaces of the precursor films and then applying a voltage higher than a breakdown voltage. As an example, a voltage of 10 to 500 V may be applied for 0.1 to 10 seconds to dielectrically break down the dielectric polymer to produce a carbon channel, specifically a carbon nanofiber in the dielectric polymer.

The precursor film may be a film in which the core-shell particles having a perovskite crystal core and a dielectric polymer shell described above are packed (including closest packed structure) in a layer form and are bound to each other by the shell. Herein, the precursor film may be a porous precursor film having an empty space between particles, or unlike this, may be a film in which a space between particles is filled with the dielectric polymer material of the shell, that is, a film in which the perovskite crystals are separately arranged and embedded in the dielectric polymer matrix. Thus, the precursor film may correspond to the electroluminescent layer in a state in which the charge transfer pathway has not yet been formed by voltage application.

In a specific example, the method of producing an electroluminescent layer may further include: a) injecting a perovskite solution including an alkali metal halide, a divalent metal halide, a surfactant, and a first polymerizable monomer into an aprotic solvent to produce perovskite crystals modified by a polymerizable monomer (having a polymerizable monomer as a ligand); b) using a polymerization solution including the perovskite crystals modified by a polymerizable monomer, a second polymerizable monomer, and an initiator to produce core-shell particles having a dielectric polymer shell formed by polymerizing the second polymerizable monomer on a perovskite crystal surface; and c) producing a film of the core-shell particles.

Specifically, the alkali metal halide may satisfy AX (A=one or two or more selected from $Na^+$, $K^+$, $Rb^+$, $Cs^+$, and $Fr^+$, and X=one or two or more selected from $I^-$, $Br^-$, $F^-$, and $Cl^-$), and the divalent metal halide may satisfy $MX_2$ (M=one or two or more selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$ and X=one or two or more selected from $I^-$, $Br^-$, $F^-$, and $Cl^-$). A mole ratio of the alkali metal halide:the divalent metal halide in the perovskite solution may be at a level of 1:1 to 3, specifically 1:1.5 to 2.5, but is not limited thereto.

The surfactant may be C1-C18 carboxylic acid, C1-C18 alkylamine, or C1-C18 carboxylic acid and C1-C18 alkylamine. The C1-C18 carboxylic acid may be one or two or more selected from the group consisting of stearic acid, decanoic acid, 4,4'-azobis(4-cyanovaleric acid), acetic acid, 5-aminosalicylic acid, acrylic acid, L-aspentic acid, 6-bromohexanoic acid, bromoacetic acid, dichloro acetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid, and oleic acid, but is not necessarily limited thereto. The C1-C18 alkylamine may be one or two or more selected from the group consisting of ethylamine, propylamine, butylamine, pentylamine, hexylamine, octylamine, decylamine, hexadecylamine, octadecylamine, oleylamine, and tri-n-octylamine, but is not necessarily limited thereto. A mole ratio of the alkali metal halide:the surfactant in the perovskite solution may be at a level of 100:0.05 to 1 mole, but is not limited thereto.

The first polymerizable monomer may be a monomer belonging to a repeating unit of the dielectric polymer to be desired. As an example, when the dielectric polymer is an acrylate-based polymer, a styrene-based polymer, or a siloxane-based polymer, the first polymerizable monomer may be an acrylate-based monomer, a styrene-based monomer, or a siloxane-based monomer. A mole ratio of the alkali metal halide:the first polymerizable monomer in the perovskite solution may be at a level of 100:1 to 10 mole, but is not limited thereto.

The solvent of the perovskite solution may be a polar organic solvent, and may include one or two or more selected from dimethylformamide, gamma butyrolactone, N-methylpyrrolidone, dimethylsulfoxide, and the like, but is not limited thereto. In addition, a molar concentration of the alkali metal halide in the perovskite solution may be at a level of 5 to 30 M, but is not limited thereto.

The aprotic solvent may be one or two or more selected from dichloroethylene, trichloroethylene, chloroform, chlorobenzene, dichlorobenzene, styrene, xylene, toluene, and cyclohexene, but is not limited thereto.

The perovskite solution may be injected with vigorous stirring of the aprotic solvent, of course, and the stirring and the injection as such (including drip) may follow the conditions used in the common production of the perovskite compound quantum dot.

The perovskite crystals having a surface ligand of the first polymerizable monomer may be produced by step a), and if necessary, a step of sorting the perovskite crystals having a desired size by centrifugation and the like may be further performed.

Step b) may be a step of forming a dielectric polymer shell on the perovskite crystal by a surface polymerization reaction by a surface ligand which is the first polymerizable monomer.

The second polymerizable monomer (or polymerizable oligomer or prepolymer) may be also a monomer belonging to a repeating unit (which may form a repeating unit) of the dielectric polymer, and depending on the specific material of the dielectric polymer, may be a monomer which is the same or different type as/from the first polymerizable monomer.

Specifically, when the dielectric polymer is an acrylate-based polymer, the first polymerizable monomer and the second polymerizable monomer may be, independently of each other, one or two or more selected from acrylate-based monomers, as an example, methylmethacrylate, ethylmethacrylate, butylmethacrylate, methylacrylate, butylacrylate, 2-hydroxyethylacrylate, 2-hydroxyethyl methacrylate, hydroxypropyl acrylate, hydroxypropyl methacrylate, pentaerythritol triacrylate, ethyleneglycol methyletheracrylate, ethyleneglycol methyl ether methacrylate, polyethyleneglycol diacrylate, polyethyleneglycol dimethacrylate, triethyleneglycol diacrylate, triethyleneglycol dimethacrylate, trimethylolpropane ethoxylate triacrylate, trimethylolpropane ethoxylate trimethacrylate, bisphenol A ethoxylate diacrylate, bisphenol A ethoxylate dimethacrylate, and the like, but is not limited thereto. When the dielectric polymer is a siloxane-based polymer, the first polymerizable monomer and the second polymerizable monomer may be, independently of each other, a silocane-based monomer, as an example, one or two or more selected from dimethylsiloxane, diethylsiloxane, methylethylsiloxane, diphenylsiloxane, methylphenylsiloxane, and ethylphenylsiloxane, but is not limited thereto. As an example, a siloxane-based prepolymer containing a silanol group as an end group may be used instead of the first polymerizable monomer. When the polymer is a styrene-based polymer, the first polymerizable monomer and the second polymerizable monomer may be, independently of each other, a styrene-based monomer, as an example, one or two or more selected from styrene, α-methylstyrene, β-methylstyrene, o-, m-, or p-methylstyrene, o-, m-, or p-ethylstyrene, and o-, m-, or p-t-butylstyrene, but is not limited thereto. In addition, when the dielectric polymer is a copolymer, the second monomer may further include other polymerizable monomers which may produce a corresponding copolymer by polymerization, of course.

The initiator may be any material commonly used in the polymerization reaction of the corresponding monomer, considering the specific materials of the first polymerizable monomer and the second polymerizable monomer. An example of the initiator may include benzoyl peroxide, acetyl peroxide, dilauryl peroxide, di-tert-butyl peroxide, t-butyl peroxy-2-ethyl-hexanoate, cumyl hydroperoxide, hydrogen peroxide, 2,2'-azobis(2-cyanobutane), 2,2'-azobis (methylbutyronitrile), AIBN (2,2'-azobis(iso-butyronitrile)), AMVN (2,2'-azobisdimethyl-valeronitrile, or the like, but is not limited thereto.

The solvent of the polymerization solution may be any solvent in which the perovskite crystals having the ligand of the first polymerizable monomer formed thereon are stably dispersed. As an example, the solvent may be an organic solvent such as a carbonate-based solvent, a nitrile-based solvent, an ester-based solvent, an ether-based solvent, a ketone-based solvent, a glyme-based solvent, an alcohol-based solvent, and an aprotic solvent, but is not limited thereto.

The polymerization solution may include 10 to 100 parts by weight of a second monomer with respect to 100 parts by weight of the perovskite crystals. The content of the second monomer relative to the perovskite crystals is a content at which a polymer coating layer having a thickness at a level of several nanometers may be formed by the polymerization reaction on the crystal surface. Herein, the content of the initiator may be any content at which the polymerization of the first monomer and the second monomer may initiate, and as an example, may be at a level of 1 to 20 parts by weight based on 100 parts by weight of the second monomer, but is not limited thereto.

The dielectric polymer shell may be formed by heating the polymerization solution to cause the polymerization reaction of the monomers (first monomer and second monomer) by the initiator. A heating temperature may be any temperature at which the polymerization reaction of the corresponding materials occurs well, considering the specific monomer and initiator materials. As an example, when the monomer is acrylate-based, styrene-based, and/or siloxane-based monomer(s), the polymerization solution may be heated to a temperature of 50 to 90° C., and the polymerization may be performed for 5 to 12 hours. After the polymerization reaction is completed, a step of separating and collecting the core-shell particles having a perovskite crystal core and a dielectric polymer shell by centrifugation or the like may be further performed, of course.

The film of the core-shell particles of step c) may be formed by applying a dispersion of the core-shell particles using spin coating or the like or using a Langmuir-Blodgett method, but is not limited thereto.

Breakdown voltage may be applied to the film of the core-shell particles obtained in step c) and penetrate the dielectric polymer shell to form a current transfer pathway to the perovskite crystals, but it is advantageous to spray an initiator solution including an initiator and an organic solvent onto the film of the core-shell particles and activate the initiator to bind the shells between core-shell particles adjacent to each other for improving mechanical properties, and also, for removing pores between particles, if necessary.

Specifically, the organic solvent included in the initiator solution may be a solvent of the dielectric polymer which may strongly dissolve the dielectric polymer shell (good solvent). As an example, the organic solvent included in the initiator solution may include chlorobenzene, dichlorobenzene, styrene, xylene, toluene, cyclohexene, or a mixed solvent thereof, but is not necessarily limited thereto. The initiator may be the same kind of material as the initiator used in polymerizing the dielectric polymer shell in step b), but is not limited thereto, and may be any material which may initiate the polymerization of the monomer used in forming the dielectric polymer. A concentration of the initiator in the initiator solution may be at a level of 0.1 to 1 wt %, but is not limited thereto.

By spraying (spray applying) the initiator solution onto the film of the core-shell particles, the shell surface of the core-shell particles is partially dissolved in the organic solvent of the initiator solution and a chemical bond may be broken by radicals provided by the activated initiator to depolymerize the surface area of the shell. Thus, the initiator solution is sprayed onto the film of the core-shell particles and the film of the core-shell particles is heated to a temperature at which the initiator is activated and the polymerization reaction occurs well, as an example, 50 to 90° C., thereby binding the core-shell particles in the film to each other by the polymerization between the shells. Herein, the amount of the sprayed initiator solution is adjusted or the initiator solution further including a third polymerizable monomer is used to cause polymerization between the shells and polymerization of the third polymerizable monomer, thereby producing a precursor film (non-porous precursor film) in which the perovskite cores are regularly separately arranged and embedded in a dense dielectric polymer matrix with no empty space between particles. A person skilled in the art may easily produce the non-porous precursor film by changing the amount of the variously sprayed initiator solution, the use and the added amount of the third monomer, and the like, substantially considering the size of the empty space determined by the size of the perovskite core. As a substantial example, when the perovskite core is a quantum dot at a level of a few to several tens of nanometers, 0.1 to 0.5 mL of the initiator solution is sprayed per unit area of the film of the core-shell particles, thereby producing the non-porous precursor film with substantially no empty space between particles, and together therewith or independently thereof, the initiator solution further including 0.01 to 5 wt % of the third polymerizable monomer may be used to produce the non-porous precursor film. Herein, the third polymerizable monomer may be the same as or different from the second polymerizable monomer, and may be one or more monomers selected from the group consisting of acryl-based monomers, siloxane-based monomers, and styrene-based monomers, but is not necessarily limited thereto.

In another specific example, the method of producing an electroluminescent layer may include: I) dissolving an amphiphilic block copolymer in a solvent to produce a micelle solution of the amphiphilic block copolymer; II) adding a divalent metal halide to the micelle solution and stirring the solution; III) adding an alkali metal halide to the micelle solution to which the divalent metal halide has been added and stirring the solution to produce core-shell particles having a perovskite crystal core and an amphiphilic block copolymer shell which is a dielectric polymer shell; and IV) producing a film of the core-shell particles.

Step I) is a step of forming micelles of the amphiphilic block copolymer, and the amphiphilic block copolymer may include a hydrophilic polymer block and a hydrophobic polymer block. The hydrophilic polymer block may include nitrogen having an unshared electron, and a divalent metal halide may be adsorbed (bonded) by the nitrogen having an unshared electron. As an advantageous example, the hydrophilic polymer block including nitrogen having an unshared electron may include a polyvinylpyridine-based polymer block, and the polyvinylpyridine-based polymer block may include poly(2-vinylpyridine) or poly(4-vinylpyridine). The hydrophobic polymer block is any material which may be copolymerized with the polyvinylpyridine-based polymer block to stably form micelles in step I), and as an example, the hydrophobic polymer block may include polyethylene, polypropylene, polystyrene, polyalkyl(meta)acrylate, and polyester, but is not limited thereto. In the amphiphilic block copolymer, a weight ratio of hydrophobic polymer block: hydrophilic polymer block may be at a level of 1:0.8 to 1.2 so that perovskite crystal cores produced may be stably enclosed while stably forming micelles in a synthesis process, but the present disclosure is not necessarily limited thereto.

The solvent in step I) may be a non-solvent of perovskite crystals. In this case, since among the divalent metal halides added in step II), the materials (divalent metal halide) absorbed in the hydrophilic polymer block may be converted into perovskite crystals, very uniform and small-sized core-shell particles may be produced, and thus, the non-solvent is advantageous. The non-solvent of the perovskite crystals may correspond to the aprotic solvent described above, and specifically, may be one or two or more selected from dichloroethylene, trichloroethylene, chloroform, chlorobenzene, dichlorobenzene, styrene, xylene, toluene, and cyclohexene, but is not necessarily limited thereto.

In step I), the amphiphilic block copolymer is added to the solvent and stirred to produce a solution in which micelles of the amphiphilic block copolymer are formed (hereinafter, referred to as a micelle solution), and the concentration of the amphiphilic block copolymer in the solution may be at a level of 1 to 10 mg/mL, specifically 2 to 6 mg/mL, but is not limited thereto.

After step I), a step of adding the divalent metal halide to the micelle solution and performing stirring to absorb the divalent metal halide in the amphiphilic block copolymer may be performed. The divalent metal halide may be added in a particulate form (powder form). As described later, since a divalent metal halide which is not absorbed and remains as a solid form (or particles) may be removed, an excessive amount of divalent metal halide is added so that the divalent metal halide may be sufficiently absorbed in the amphiphilic block copolymer, specifically the hydrophilic polymer block of the amphiphilic block copolymer. As a substantial example, 5 to 30 times the mass of the divalent metal halide based on the mass of the amphiphilic block copolymer in the micelle solution may be added, but is not limited thereto.

The divalent metal halide may satisfy $MX_2$. Herein, M is a divalent metal and one or two or more selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is a halogen and one or two or more selected from $I^-$, $Br^-$, $F^-$, and $Cl^-$.

The addition and the stirring of the divalent metal halide may be performed at room temperature, and the stirring may be performed for a period of time during which the divalent metal halide is completely absorbed in the amphiphilic block copolymer, specifically the hydrophilic polymer block so that absorption does not occur any more. As a substantial example, stirring may be performed for a day to four weeks, specifically one to two weeks, but is not necessarily limited thereto.

Thereafter, a step of removing a remaining divalent metal halide which is not dissolved, that is, not absorbed in the hydrophilic block of the amphiphilic block copolymer may be further performed. The remaining divalent metal halide may be separated and removed using usual solid-liquid separation such as precipitation or centrifugation.

After step II), preferably after removing the remaining divalent metal halide, III) adding an alkali metal halide to a micelle solution to which the divalent metal halide has been added and performing stirring to produce core-shell particles having a perovskite crystal core and an amphiphilic block copolymer shell which is a divalent metal halide shell may be performed.

The alkali metal halide may satisfy AX wherein A is an alkali metal and one or two or more selected from $Na^+$, $K^+$, $Rb^+$, $Cs^+$, and $Fr^+$, and X is a halogen and one or two or more selected from $I^-$, $Br^-$, $F^-$, and $Cl^-$, but the present invention is not limited thereto.

The added alkali metal halide may be added in an amount sufficient to completely convert the divalent metal halide absorbed in the amphiphilic block copolymer into perovskite crystals. As an example, the alkali metal halide may be added so that the amount is 0.01 to 0.1 parts by weight based on the mass of the amphiphilic block copolymer (1). The alkali metal halide may be added in a solution form, and the solvent of the alkali metal halide solution may be any material which the alkali metal halide is dissolved in and has compatibility with the solvent of the micelle solution. As an example, when the solvent of the micelle solution is an aprotic solvent, the solvent of the alkali metal halide solution may be acetone, methanol, ethanol, and the like, but is not limited thereto.

In step III), when the alkali metal halide is added after absorbing the divalent metal halide in the hydrophilic polymer block of the amphiphilic block copolymer forming micelles, the absorbed divalent metal halide may be converted into the perovskite crystal core by the self-assembly properties of the perovskite compound. Thus, by adding the alkali metal halide and performing stirring in step III), core-shell particles having a perovskite crystal core and an amphiphilic block copolymer shell which is a dielectric polymer shell may be produced. Thereafter, core-shell particles synthesized by common solid-liquid separation such as centrifugation may be recovered, and the alkali metal halide which is an unreacted residue may be removed.

Step IV) of converting the produced core-shell particles into a film may correspond to step c) described above, and the film of the core-shell particles may be formed by applying a dispersion of the core-shell particles using spin coating or the like or using a Langmuir-Blodgett method, but is not limited thereto.

After producing the film of the core-shell particles by step IV) or step c), as described above, breakdown voltage is applied to the produced precursor film to form a charge transfer pathway which penetrates the dielectric polymer and connects the perovskite crystals, as an example, a carbon channel, thereby producing the electroluminescent layer described above.

As described above, the method of producing an electroluminescent layer according to the present invention includes a step of producing core-shell particles of a perovskite crystal core and a dielectric polymer shell. Thus, the present invention includes the method of producing core-shell particles including steps a) and b) described above or a method of producing core-shell particles including steps I) to III).

As described above, the method of producing an electroluminescent layer according to the present invention includes a production step of converting the core-shell particles of a perovskite crystal core and a dielectric polymer shell into a film. Thus, the present invention includes a method of producing a perovskite film including steps a) to c) described above or a method of producing a perovskite film including steps I) to IV) described above.

Example 1

Figure 1:
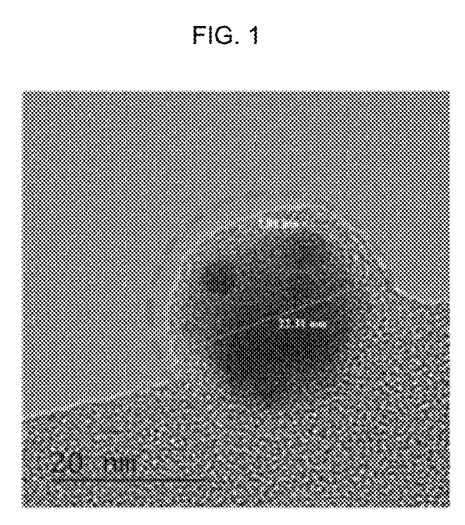
FIG. 1 is a transmission electron micrograph of a perovskite crystal modified by an MMA ligand produced in an exemplary embodiment.

42 mg of cesium bromide (CsBr) and 146.8 mg of lead bromide ($PbBr_2$) were dissolved in 10 ml of a dimethylformamide (DMF) solvent, and 160 μL of oleylamine and 300 μL of methyl methacrylate (MMA) were added to produce a cesium lead bromide ($CsPbBr_3$) precursor solution. 150 μL of the precursor solution was injected into a toluene solution under vigorous stirring to produce cesium lead bromide particles. Thereafter, only MMA-$CsPbBr_3$ quantum dots having a diameter of 15-25 nm were separated and recovered by centrifugation. FIG. 1 is a transmission electron micrograph of a perovskite crystal modified by an MMA ligand produced.

10 μL of methyl methacrylate, 1 μL of methacryloxypropyl-terminated polydimethylsiloxane as a surface stabilizer, and 1 mg of azobisisobutyronitrile (AIBN) as a polymerization reaction initiator were dissolved in 4 mL of a quantum dot solution (solvent=n-hexane) containing 0.5 wt % of perovskite crystals and reacted at 70° C. for 12 hours to produce core-shell particles of $CsPbBr_3$/polymethyl methacrylate (PMMA), and core-shell particles produced by centrifugation were recovered. At this time, the thickness of the PMMA coating layer was about 3 nm.

The $CsPbBr_3$/PMMA core-shell particle dispersion was spin coated on a substrate to produce a $CsPbBr_3$/PMMA core-shell particle packed film.

An initiator solution in which azobisisobutyronitrile (AIBN) as a polymerization reaction initiator was dissolved at 1 wt % in toluene was sprayed onto the prepared film of the core-shell particles at 0.1 mL per unit area of the film and reacted at 70° C. to produce an intershell polymerized precursor film.

Electrodes were placed on both surfaces of the prepared precursor film, a voltage of 10 V was applied for 1 sec to cause dielectric breakdown of PMMA to form a conduction pathway.

Example 2

Figure 2:
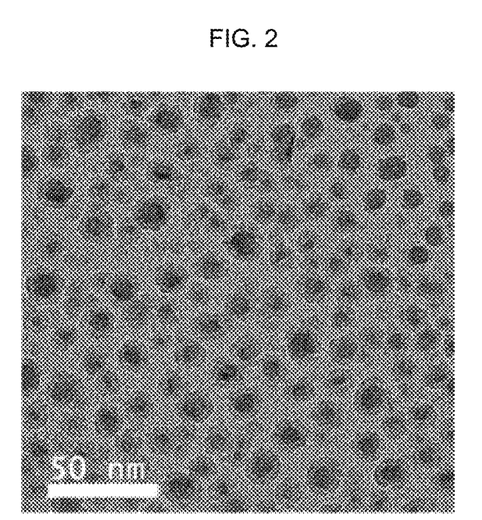
FIG. 2 is a transmission electron micrograph of core-shell precursor particles of a divalent metal halide core and an amphiphilic block copolymer shell as an intermediate product in the production process according to an exemplary embodiment.

47.5 mg of polystyrene-block-poly-2-vinylpyridine (PS-b-P2VP, PS block $57.0 \times 10^3$ g/mol, P2VP block $57.0 \times 10^3$ g/mol, PDI=1.05) was dissolved in 10 ml of toluene at room temperature to produce a micelle solution. 829 mg of lead bromide ($PbBr_2$) was added to the produced micelle solution and stirring was performed for 2 weeks until $PbBr_2$ was completely absorbed in the P2VP block. After stirring for 2 weeks, an excessive amount of undissolved $PbBr_2$ was precipitated for 12 hours for removal, and centrifuged at 1000 rpm for 5 minutes to prepare a micelle solution in which PbBr$_2$ was absorbed. Cesium bromide (CsBr) was dissolved in methanol to produce a cesium bromide solution at a concentration of 15 mg/mL, 0.2 mL of the cesium bromide solution was injected into the micelle solution in which PbBr$_2$ was absorbed and stirred to produce core-shell particles in which a perovskite (CsPbBr$_3$) crystal core is enclosed in PS-b-P2VP, and the produced core-shell particles were recovered by centrifugation (1000 rpm, 5 minutes). FIG. 2 is a transmission electron micrograph of a product of an intermediate step of absorbing PbBr$_2$ in a P2VP block (before adding CsBr), from which it may be confirmed that PbBr$_2$ core/PS-b-P2VP shell may be produced by PbBr$_2$ absorption by the micelle of the amphiphilic block copolymer and the P2VP block, and it may be recognized that PbBr$_2$ core/PS-b-P2VP shell is produced very finely and uniformly. The core-shell precursor particles of the divalent metal halide core and the amphiphilic block copolymer shell were easily converted into core-shell particles of the perovskite crystal core and the amphiphilic block copolymer shell by adding an alkali metal halide and performing stirring.

Hereinabove, although the present invention has been described by specific matters, limited exemplary embodiments, and drawings, they have been provided only for assisting the entire understanding of the present invention, and the present invention is not limited to the exemplary embodiments, and various modifications and changes may be made by those skilled in the art to which the present invention pertains from the description.

Therefore, the spirit of the present invention should not be limited to the above-described exemplary embodiments, and the following claims as well as all modifications equal or equivalent to the claims are intended to fall within the scope and spirit of the invention.

The invention claimed is:

1. An electroluminescent layer comprising: core-shell particles including a perovskite crystal core and a dielectric polymer shell, wherein a charge transfer pathway to the perovskite crystal core is formed by dielectric breakdown of the dielectric polymer.

2. The electroluminescent layer of claim 1, wherein the core-shell particles adjacent to each other are bound to each other.

3. The electroluminescent layer of claim 2, wherein the core-shell particles are the most closely packed.

4. An electroluminescent layer comprising: a dielectric polymer matrix; perovskite crystals which are embedded in the dielectric polymer matrix and has a closest packed structure; and a charge transfer pathway which is formed by dielectric breakdown of the dielectric polymer and connects perovskite crystals.

5. The electroluminescent layer of claim 1, wherein a spacing between the perovskite crystals is 10 nm or less.

6. The electroluminescent layer of claim 1, wherein the dielectric polymer has a dielectric constant of 2 or more.

7. The electroluminescent layer of claim 1, wherein the dielectric polymer includes an amphiphilic block copolymer.

8. The electroluminescent layer of claim 1, wherein the charge transfer pathway is a carbon channel produced by dielectric breakdown.

9. The electroluminescent layer of claim 1, wherein the core-shell particles adjacent to each other are integrally connected by polymerization between the shells.

10. The electroluminescent layer of claim 1, wherein the perovskite crystals have a diameter of 10 to 300 nm.

11. The electroluminescent layer of claim 1, wherein the perovskite crystals satisfy the following Chemical Formulae 1 to 4:

$$AMX_3 \quad \text{(Chemical Formula 1)}$$

$$A_2MX_4 \quad \text{(Chemical Formula 2)}$$

$$AMX_4 \quad \text{(Chemical Formula 3)}$$

$$A_3MX_5 \quad \text{(Chemical Formula 4)}$$

wherein A is an alkali metal, M is a divalent metal, and X is a halogen.

12. A light emitting device comprising:
a first electrode;
a hole transport layer placed on the first electrode;
the electroluminescent layer according to claim 1 placed on the hole transport layer;
an electron transport layer placed on the electroluminescent layer; and
a second electrode placed on the electron transport layer.

13. A method of producing an electroluminescent layer, the method comprising: applying voltage to a precursor film in which perovskite crystals are enclosed in a dielectric polymer to cause dielectric breakdown of the dielectric polymer.

14. The method of producing an electroluminescent layer of claim 13, further comprising:
before the applying of voltage,
a) injecting a perovskite solution including an alkali metal halide, a divalent metal halide, a surfactant, and a first polymerizable monomer into an aprotic solvent to produce perovskite crystals modified by a polymerizable monomer;
b) using a polymerization solution including the perovskite crystals modified by a polymerizable monomer, a second polymerizable monomer, and an initiator to produce core-shell particles having a dielectric polymer shell formed by polymerizing the second polymerizable monomer on a perovskite crystal surface; and
c) producing a film of the core-shell particles.

15. The method of producing an electroluminescent layer of claim 14, further comprising:
after the process of c) and before the applying of voltage,
d) spraying an initiator solution including an initiator and an organic solvent onto the film of the core-shell particles and activating the initiator to bind the shells between the core-shell particles adjacent to each other.

16. The method of producing an electroluminescent layer of claim 15, wherein in the process of d), the organic solvent is a solvent dissolving the dielectric polymer.

17. The method of producing an electroluminescent layer of claim 14, wherein in the process of d), the initiator solution further includes a third polymerizable monomer.

18. The method of producing an electroluminescent layer of claim 14, wherein the first polymerizable monomer and the second polymerizable monomer are independently of each other one or two or more selected from acrylate-based monomers, methacrylate-based monomers, styrene-based monomers, and siloxane-based monomers.

19. The method of producing an electroluminescent layer of claim 13, further comprising:
before the applying of voltage,
I) dissolving an amphiphilic block copolymer in a solvent to produce a micelle solution of the amphiphilic block copolymer;

II) adding a divalent metal halide to the micelle solution and performing stirring;

III) adding an alkali metal halide to the micelle solution to which the divalent metal halide has been added and performing stirring to produce core-shell particles having a perovskite crystal core and an amphiphilic block copolymer shell which is a dielectric polymer shell; and IV) producing a film of the core-shell particles.

20. The method of producing an electroluminescent layer of claim 19, wherein the amphiphilic block copolymer includes a polyvinylpyridine-based polymer block.

21. The method of producing an electroluminescent layer of claim 20, wherein the polyvinylpyridine-based polymer block is poly(2-vinylpyridine) or poly(4-vinylpyridine).

22. The method of producing an electroluminescent layer of claim 20, wherein a weight ratio of a hydrophobic polymer block:the polyvinylpyridine-based polymer block in the amphiphilic block copolymer is 1:0.8 to 1.2.

23. The method of producing an electroluminescent layer of claim 20, wherein the solvent of the process of I) is a non-solvent of the perovskite crystals, and after the process of II) and before the process of III), removing the divalent metal halide remaining as a solid phase is further comprised.

* * * * *